(12) United States Patent
Menon et al.

(10) Patent No.: US 12,183,412 B2
(45) Date of Patent: Dec. 31, 2024

(54) METHOD AND APPARATUS FOR ENABLING MULTIPLE RETURN MATERIAL AUTHORIZATIONS (RMAs) ON AN INTEGRATED CIRCUIT DEVICE

(71) Applicant: Intel Corporation, Santa Clara, CA (US)

(72) Inventors: Sankaran M. Menon, Austin, TX (US); Andrew Martyn Draper, Chesham (GB); Ting Lu, Austin, TX (US); Kenneth Chen, San Francisco, CA (US); Wei Chun Lau, San Jose, CA (US)

(73) Assignee: ALTERA CORPORATION, San Jose, CA (US)

( * ) Notice: Subject to any disclaimer, the term of this patent is extended or adjusted under 35 U.S.C. 154(b) by 826 days.

(21) Appl. No.: 17/033,526

(22) Filed: Sep. 25, 2020

(65) Prior Publication Data

US 2021/0012855 A1    Jan. 14, 2021

(51) Int. Cl.
| | | |
|---|---|---|
| *G11C 29/00* | (2006.01) | |
| *G11C 17/14* | (2006.01) | |
| *G11C 17/16* | (2006.01) | |
| *G11C 29/16* | (2006.01) | |
| *G11C 29/38* | (2006.01) | |
| *G11C 29/44* | (2006.01) | |
| *G11C 29/50* | (2006.01) | |

(52) U.S. Cl.
CPC ............ *G11C 29/44* (2013.01); *G11C 17/143* (2013.01); *G11C 17/16* (2013.01); *G11C 29/16* (2013.01); *G11C 29/38* (2013.01); *G11C 2029/4402* (2013.01); *G11C 2029/5002* (2013.01)

(58) Field of Classification Search
CPC ....... G11C 29/44; G11C 17/143; G11C 17/16; G11C 29/16; G11C 29/38; G11C 2029/4402; G11C 2029/5002
See application file for complete search history.

(56) References Cited

U.S. PATENT DOCUMENTS

| | | |
|---|---|---|
| 5,796,269 A | 8/1998 | New |
| 6,909,663 B1 | 6/2005 | Vernenker et al. |
| 7,289,372 B1 | 10/2007 | Yu et al. |

(Continued)

FOREIGN PATENT DOCUMENTS

| | | |
|---|---|---|
| CN | 1489732 A | 4/2004 |
| CN | 103928047 A | 7/2014 |

(Continued)

OTHER PUBLICATIONS

Chinese Office Action dated Mar. 2, 2020 for application No. 201110311561.7.

*Primary Examiner* — Mushfique Siddique
(74) *Attorney, Agent, or Firm* — Fletcher Yoder, P.C.

(57) ABSTRACT

An integrated circuit (IC) device configured for multiple return material authorizations (RMAs) is provided. The IC device includes an asset and a return material authorization (RMA) counter fuse including a first fuse, a second fuse, and a third fuse. The IC device enters an RMA state in response to blowing the first fuse, a second state in response to blowing the second fuse, and the RMA state in response to blowing the third fuse.

20 Claims, 3 Drawing Sheets

(56) References Cited

U.S. PATENT DOCUMENTS

| | | | |
|---|---|---|---|
| 2005/0242924 A1* | 11/2005 | Yosim | G06F 21/71 |
| | | | 340/5.74 |
| 2006/0092740 A1 | 5/2006 | Nii | |
| 2006/0092746 A1 | 5/2006 | Nii | |
| 2006/0131743 A1* | 6/2006 | Erickson | G06F 21/71 |
| | | | 257/737 |
| 2007/0002668 A1 | 1/2007 | Williams et al. | |
| 2007/0118880 A1* | 5/2007 | Mauro, II | G06F 21/79 |
| | | | 726/4 |
| 2009/0244991 A1 | 10/2009 | Iwasa et al. | |
| 2012/0224435 A1 | 9/2012 | Nukaraju et al. | |
| 2018/0189493 A1* | 7/2018 | Schilder | G01R 31/31719 |
| 2019/0107576 A1* | 4/2019 | Sinegre | G06F 9/4401 |
| 2021/0141741 A1* | 5/2021 | Meier | G11C 17/16 |
| 2021/0141744 A1* | 5/2021 | Van Leeuwen | G06F 21/79 |
| 2022/0269825 A1* | 8/2022 | Stratan | G06F 21/31 |

FOREIGN PATENT DOCUMENTS

| | | |
|---|---|---|
| CN | 104217752 A | 12/2014 |
| CN | 104685465 A | 6/2015 |

* cited by examiner

METHOD AND APPARATUS FOR ENABLING MULTIPLE RETURN MATERIAL AUTHORIZATIONS (RMAs) ON AN INTEGRATED CIRCUIT DEVICE

BACKGROUND

The present disclosure generally relates to return material authorizations (RMAs). More particularly, the present disclosure relates to enabling an integrated circuit (IC) device for an RMA.

This section is intended to introduce the reader to various aspects of art that are related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Return Material Authorizations (RMAs) may enable a customer (e.g., an entity) to return a defective or non-functional part to a manufacturer to get the part fixed or to obtain a replacement to the part. However, many RMAs merely allow a customer to return the part once and may be limited in security of assets associated with the part.

BRIEF DESCRIPTION OF THE DRAWINGS

Various aspects of this present disclosure may be better understood upon reading the following detailed description and upon reference to the drawings in which.

DETAILED DESCRIPTION OF SPECIFIC EMBODIMENTS

Figure 1:
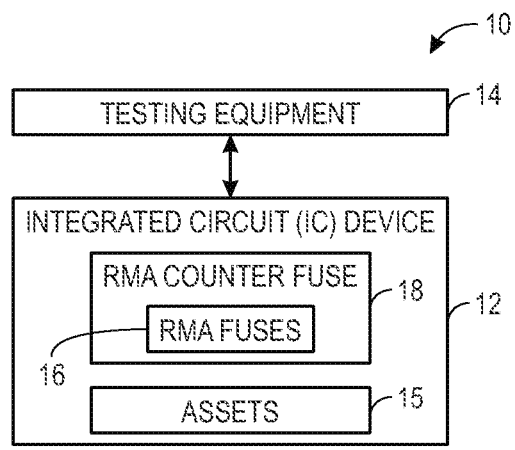
FIG. 1 is a block diagram illustrating an integrated circuit (IC) device coupled to testing equipment, wherein the IC device includes return material authorization (RMA) fuses, in accordance with an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

An RMA may enable a customer (e.g., an original equipment manufacturer (OEM), an original design manufacturer (ODM), an entity) to return one or more parts or components of an integrated circuit (IC) device that may be nonfunctional or defective to a manufacturer of the one or more parts or components. The RMA may also enable the customer to keep customer-owned and/or customer-design assets that are loaded on the IC device confidential before the customer sends the one or more parts or components to the manufacturer. The one or more parts or components may further be tracked via the RMA. When the IC device is with the manufacturer, the manufacturer may run root-cause analysis, as well as fix or replace the one or more parts or components, and send the fixed or replaced one or more parts or components to the customer. Previous RMA techniques merely provided single RMA for a defective part. That is, once a part has undergone an RMA, the part may be hindered from undergoing an RMA again.

The present systems and techniques relate to embodiments for enabling multiple and/or nested return material authorization (RMAs) on an integrated circuit (IC) device. Such systems and techniques may disable access to one or more assets on the IC device during an RMA, and further, may allow the IC device to undergo multiple RMA cycles. As such, the present systems and techniques allow for an IC device to securely undergo multiple RMA cycles, which may be advantageous and cost efficient especially if the IC device, having undergone an RMA, is discovered as having an additional defect or non-functional component, for example.

Turning to the drawings, FIG. 1 is a block diagram 10 illustrating an integrated circuit (IC) device 12 coupled to testing equipment 14 (e.g., automated testing equipment), in accordance with an embodiment of the present disclosure. Specifically, the IC device 12 contains assets 15 (e.g., circuitry, nonvolatile code, a field programmable gate array circuit design) and return material authorization (RMA) fuses 16 that are configured to be used to change a state or mode of the IC device 12. More specifically, the RMA fuses 16 (e.g., RMA fuse bits) may be configured to put the IC device 12 in a secure state (e.g., an RMA state) while the IC device 12 is undergoing RMA. The RMA fuses 16 may be stored in or on an RMA counter fuse 18. The IC device 12 may be configured to undergo multiple RMAs via the RMA fuses 16 that are coupled to the IC device 12. As such, multiple and/or nested RMA is enabled on the IC device 12, which in some embodiments, may represent a particular part or component of a device or circuitry, because the IC device 12 may enter an RMA state multiple times.

In some embodiments, the testing equipment 14 may include at least a memory and at least a processor that executes instructions stored in the memory, in addition to other components such as a user interface and/or testing software. As such, the IC device 12 may be configured to be tested by the testing equipment 14.

Figure 2:
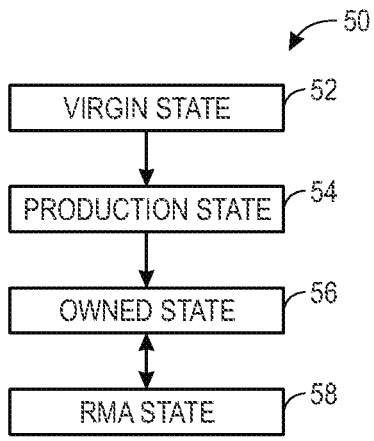
FIG. 2 is an example of a plurality of states in which the IC device of FIG. 1 may be configured, in accordance with an embodiment of the present disclosure.

FIG. 2 illustrates various states in which the IC device 12 may be configured based on a status of various fuses on the IC device 12. The statuses (e.g., blown status or not-blown status) of one or more fuses of the IC device 12 may, in some embodiments, determine an ownership of the IC device 12 and/or determine whether one or more operations are enabled or disabled on the IC device 12. When the IC device 12 is with a manufacturer of the IC device 12, the state of the IC device 12 may be in a VIRGIN state 52. In the VIRGIN state 52, the IC device 12 may not include customer-owned or customer-designed assets. One or more fuses may be blown to move the IC device 12 from the VIRGIN state 52 to a PRODUCTION state 54. For example, after running manufacturing tests and confirming that the IC device 12 passes the tests and meets certain quality criteria given by the manufacturer, the IC device 12 may be sent to a customer (e.g., an OEM/ODM, an entity). Once the customer receives the IC device 12, which is in the PRODUCTION state 54, as indicated by the status of certain fuses on the IC device 12, the customer may cause one or more additional fuses on the IC device 12 to be blown to put the IC device 12 into an OWNED state 56. The OWNED state 56 may be a secure state in which the customer may add the assets 15 into the IC device 12. The assets 15 may include specific circuitry, stored instructions, etc. Other assets from other entities may also be added to the IC device 12 while the IC device 12 is in the OWNED state 56 or in another state.

If the customer finds an issue with the IC device 12, such as a non-functional or defective part or component on the IC device 12, then the customer may desire to return the IC device 12 (e.g., the non-functional or defective part or component) to the manufacturer such as the entity in possession of the IC device 12 when the IC device 12 was in the VIRGIN state 52. The customer may return the IC device 12 via an RMA. In some embodiments, to enable RMA, the customer may generate, sign, and issue a certificate such as a per-device certificate that enables the IC device 12 to undergo the RMA. The certificate may be stored in the IC device 12. The certificate may also be used by the customer to communicate, to the IC device 12, instructions to blow an RMA fuse 16. The customer may, for example, command the IC device 12 to blow the RMA fuse 16 to move the IC device 12 from the OWNED state 56 to the RMA state 58, thus establishing the IC device 12 as being in an RMA state 58. In some embodiments, the IC device 12 may be moved from the OWNED state 56 to the RMA state 58 based on a per-owner certificate and a per-device certificate. The manufacturer may receive the IC device 12, which is in the RMA state 58. However, even if the IC device 12 is not in the RMA state 58, the manufacturer may still be able to determine the state of the IC device 12.

Once the manufacturer receives the IC device 12, the manufacturer may cause the IC device 12 to be coupled to testing equipment such as the testing equipment 14 in FIG. 1. Returning again to FIG. 1, the manufacturer may run tests, such as production manufacturing tests, as well as to root-cause analysis to identify, confirm, and/or determine the issue reported by the customer. After performing appropriate fixes on the IC device 12, the IC device 12 may be decoupled from the testing equipment and sent back to the customer. Once the customer receives the part the IC device 12, the customer may cause the IC device 12 to blow another fuse to place the IC device 12 in the OWNED state 56 (as indicated by the double-side arrow in FIG. 2).

If additional issues are discovered with the IC device 12 after the IC device 12 has left the RMA state 58 and entered the OWNED state 56, then an RMA may be repeated via the techniques described herein. Specifically, via the techniques described herein, the IC device 12 may be configured to return to the RMA state 58 (as indicated by the double-side arrow in FIG. 2). More specifically, by using additional certificates and fuse bits on the IC device 12, the IC device 12 may include a mechanism to repeat configuring the IC device 12 for one or more additional RMAs. As such, the IC device 12 may undergo an RMA multiple times (e.g., two or more times), even in proportion to the number of RMA fuses 16 implemented on the IC device 12. The number of RMA fuses 16 can be increased to as many number of RMAs as desired by the customer, thus resulting in multiple/nested RMAs.

Figure 3:
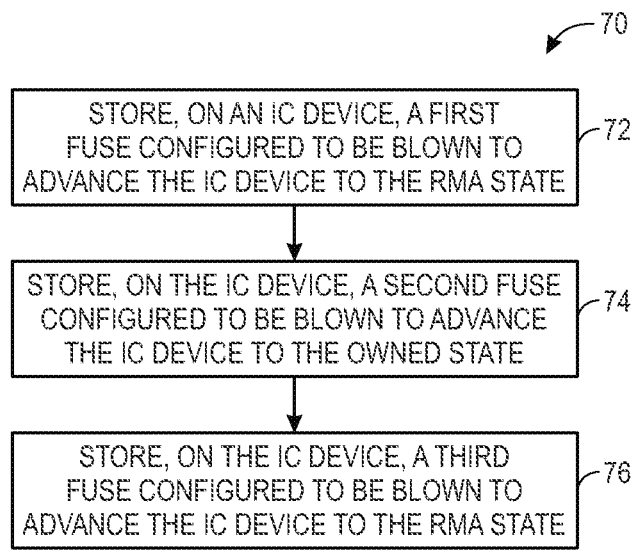
FIG. 3 is an example flow chart illustrating a method for storing RMA fuses on the IC device of FIG. 1, wherein the RMA fuses are configured to be utilized in respective RMAs, in accordance with an embodiment of the present disclosure.

FIG. 3 illustrates a flow chart of a method 70 for storing RMA fuses 16 on the IC device 12, in accordance with an embodiment of the present disclosure. The RMA fuses 16 may be configured to be utilized in successive RMAs. Further, some RMA fuses 16, when blown, may cause the IC device 12 to enter the RMA state 58 (e.g., be configured or reconfigured for RMA) and some RMA fuses 16, when blown, may cause the IC device 12 to leave the RMA state 58. The method 70 begins with storing (block 72), on the IC device 12, a first RMA fuse configured to be blown to configure the IC device 12 for a first RMA. The first RMA fuse (e.g., an odd fuse bit), when blown may cause the IC device 12 to enter (e.g., advance to) the RMA state 58. The method 70 may proceed to storing (block 74), on the IC device 12, a second RMA fuse configured to be blown to advance the IC device 12 to the OWNED state 56. The second RMA fuse (e.g., an even fuse bit), when blown may cause the IC device to leave the RMA state 58 (e.g., enter the OWNED state 56). The method 70 may continue with storing (block 76) a third RMA fuse (e.g., an odd fuse bit) that, when blown, causes the IC device 12 to re-enter the RMA state 58. The first RMA fuse, the second RMA fuse, and/or the third RMA fuse may be coupled to the IC device 12 during the manufacturing of the IC device 12 or during another time period of the IC device 12 such as after the manufacturing of the IC device 12. As such by performing the method 70, the IC device 12 may be enabled to undergo multiple and/or nested RMAs. It should be noted that various patterns of blowing fuses may be applied in various embodiments of the IC device 12 to advance the IC device to different states.

Figure 4:
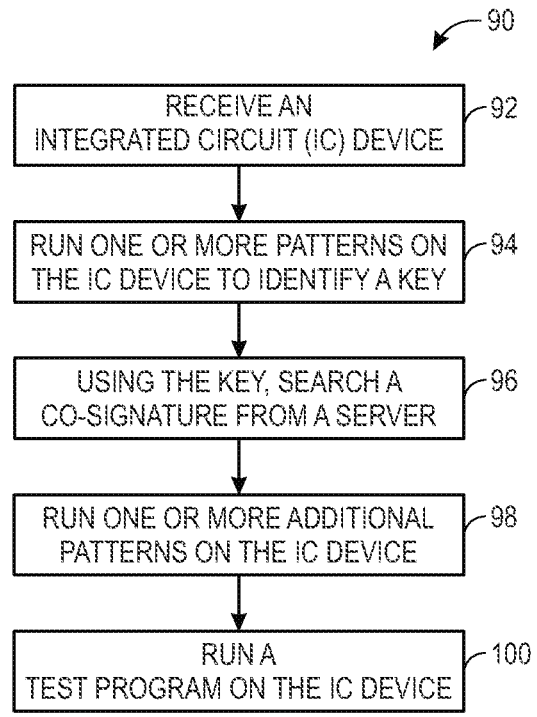
FIG. 4 is an example flow chart illustrating a method for testing the IC device of FIG. 1, in accordance with an embodiment of the present disclosure.

FIG. 4 is a flow chart of a method 90 for testing the IC device 12 of FIG. 1, in accordance with an embodiment of the present disclosure. One or more steps of the method 90 may be performed by the testing equipment 14 of FIG. 1. The method 90 may be also be performed by one or more servers, circuitries, memories, software, and/or hardware that are configured to perform operations that include at least one operation enumerated in FIG. 4. Indeed, one or more servers, circuitries, memories, software, and/or hardware of a computing system may detect and/or be utilized in the testing of the IC device 12. The method 90 begins with receiving (block 92) an IC device 12. The IC device 12 may be in the RMA state 58. The IC device 12 may have been put into the RMA state 58 by a manufacturer (e.g., a first entity) of the IC device 12 or by a customer (e.g., a second entity). As an example, block 92 may be performed by a component of a computer system that detects the presence of the IC device 12 and/or detects the state of the IC device 12.

Specifically, the state of the IC device 12 may be detected by the component. Accordingly, in one instance, the IC device 12 may be in any state such as the OWNED state 56 or the RMA state 58 (e.g., a DISOWNED state). The component may be able to detect the specific state of the IC device 12. In another example, receiving the IC device 12 may simply include coupling, via a physical mechanism, the IC device 12 to the testing equipment 14.

In response to determining that the IC device 12 is in an RMA state 58, the method 90 may proceed to run (block 94) one or more patterns (e.g., sequences of code, algorithms, tests, etc.) on the IC device 12 to identify a key on the IC device 12. The one or more patterns may include applying a stimulus to the IC device 12 and determining if the IC device 12 responds with a correct response. In some embodiments, the one or more patterns may be configured to detect and/or read an owner/root hash key, a co-signing flag, and/or an owner cancellation fuse. The key may be necessary to unlock the IC device 12 to perform certain tests or read certain data on the IC device 12. Indeed, the key may be identified by the results of the execution of the one or more patterns on the IC device 12, and further, may be necessary to unlock the IC device 12. Additionally, in some embodiments, one or more tests may be performed at block 92. In these embodiments, these one or more tests may include a continuity test, a power short test, a power-up device test, and so forth. Nevertheless, using the identified key, a co-signature may be searched from a server (block 96).

In response to identifying the co-signature, the method 90 may proceed with running (block 98) one or more additional patterns (e.g., sequences of code, algorithms, etc.) on the IC device 12. The one or more additional patterns may include patterns that are configured to be utilized to unlocking the IC device 12. After unlocking the IC device 12, the method 90 may proceed to run (block 100) a test program configured to test the IC device 12.

Figure 5:
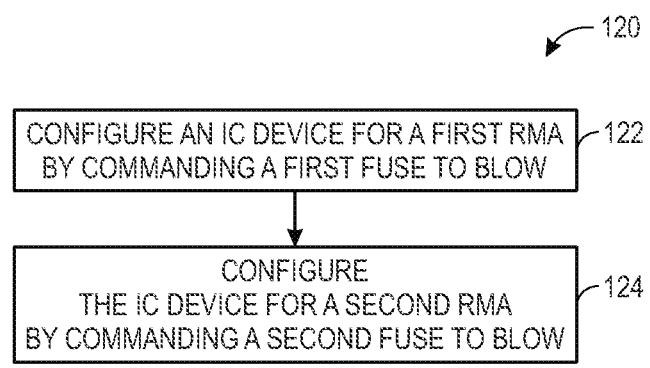
FIG. 5 is an example flow chart illustrating a method for configuring the IC device of FIG. 1 for multiple RMAs, in accordance with an embodiment of the present disclosure.

FIG. 5 is an example flow chart illustrating a method 120 for configuring the IC device 12 of FIG. 1 for multiple RMAs, in accordance with an embodiment of the present disclosure. The method 120 may be performed by a computing system coupled to the IC device 12. Indeed, a computing system operated by an entity may be configured to control or send commands to the IC device 12. The method 120 begins with configuring (block 122) the IC device 12 for a first RMA by commanding a first fuse (e.g., a first RMA fuse 16) to blow. The command may be given via the execution of one or more instructions stored in a memory (e.g., a non-transitory, tangible, and machine-readable medium) and accessed via a processor of the computing system. In other embodiments, the command may be sent to the IC device 12 or, more specifically, to a certain component of the IC device 12 that may initiate the blowing of the first fuse. Further, the command may be sent to the IC device 12 in response to a customer receiving an RMA certificate (e.g., a per-device certificate) that indicates instructions to blow a specific fuse (e.g., odd bit 1, 3, or 5) on an RMA counter fuse 18 of the IC device 12 to put the IC device 12 in an RMA state 58. The customer may send the IC device 12 to the manufacturer (e.g., a second entity), where the IC device 12 may be coupled to testing equipment 14 of FIG. 1 for testing by the manufacturer.

When the manufacturer returns the IC device 12 to the customer, the customer may blow another fuse on the RMA counter fuse 18 to cause the IC device 12 to leave the RMA state 58. For example, the other fuse on the RMA counter fuse 18 may be blown to put the IC device 12 back into the OWNED state 56, for example. Indeed, as an example, an even bit such as even bit 2, 4, or 6 on the RMA counter fuse 18 may be blown by the customer to put the IC device 12 into the OWNED state 56 or another state that is different from the RMA state 58. Blowing the other fuse may also enable access to one or more assets on the IC device 12. Although not shown in the illustrated method 120, a fuse may be blown to cause the IC device 12 to leave the RMA state 58 in between the steps noted by block 122 and block 124.

The customer may discover additional issues with the IC device 12 after leaving the RMA state 58, and as such, may desire an additional RMA for the IC device 12. Accordingly, using the techniques disclosed herein, the IC device 12 may become configured (block 124) for a second RMA by commanding a second fuse (e.g., a second RMA fuse 16) to be blown. As an example, the second fuse may be an odd bit fuse that is configured to be blown to put the IC device 12 into an RMA state 58. Additionally, to initiate RMA for the IC device 12, the customer may first receive, from a manufacturer (e.g., a first entity), an additional certificate that discloses information or instructions to blow a specific fuse on the RMA counter fuse 18. By configuring the IC device 12 for the second RMA by commanding the second fuse to blow, the IC device 12 may be configured for the second RMA.

Figure 6:
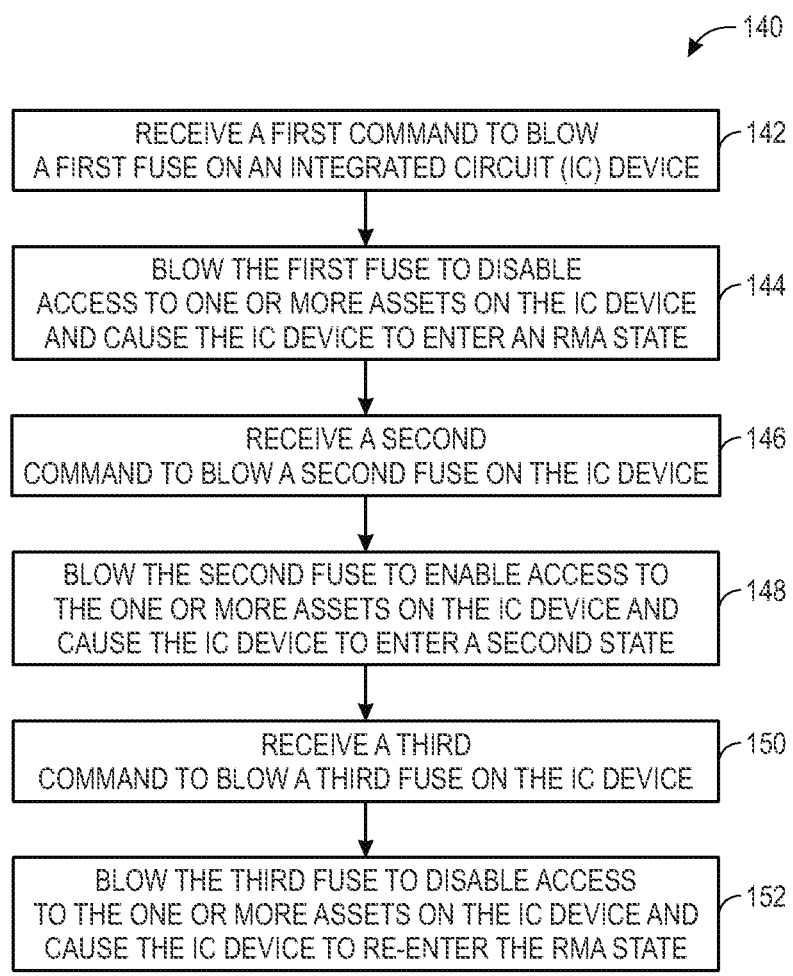
FIG. 6 is an example flow chart illustrating a method for blowing RMA fuses on the IC device of FIG. 1, in accordance with an embodiment of the present disclosure.

FIG. 6 is an example flow chart illustrating a method 140 for blowing RMA fuses on the IC device 12, in accordance with an embodiment of the present disclosure. The method 140 may be performed by the IC device 12. The method begins with receiving (block 142) a first command to blow a first fuse (e.g., an RMA fuse 16) on the IC device 12. The first command may be received in response to a customer (e.g., a first entity, the owner of the IC device) receiving a certificate that indicates a specific fuse to blow on the IC device 12, for example. In response to receiving the first command, the IC device 12 may blow (block 144) the first fuse. Blowing the first fuse on the IC device 12 may disable access to or enable confidentiality of assets on the IC device 12, and further may cause the IC device 12 to be configured in an RMA state 58 (e.g., as an RMA unit). For example, by blowing the first fuse, assets (i.e., one or more assets) on the IC device 12 may be protected or hidden via encryption, or otherwise have a reduced amount of visibility in the RMA state 58 as compared with the visibility of the assets in the previous state. Other ways to disable access to the assets on the IC device 12 include replacing the assets with a test version, removing a key from the IC device 12, removing an asset of the assets from the IC device 12. Disabling access to the assets on the IC device 12 may be desirable because a third party or a first entity such as an owner of the IC device 12 may not desire a second entity that is different than the first entity to have insight or unsupervised access into the third party's or first entity's assets on the IC device 12. As such, by configuring the IC device 12 as an RMA unit by blowing the first fuse, ownership of the IC device 12 may be recognized and permission to perform certain operations on the IC device 12 may be enforced, while disabling access to the assets on the IC device 12.

In response to receiving the IC device 12 back from the manufacturer or other entity that may work on the IC device 12, the customer may send a second command to the IC device 12 to blow a second fuse (e.g., a second RMA fuse 16). The IC device 12 may receive (block 146) the second command to blow the second fuse on the IC device 12 and then blow (block 148) the second fuse. The second fuse may be blown during a time period beginning after the first fuse is blown. By blowing the second fuse, access to the assets on the IC device 12 may be enabled. Further, the IC device 12 may become reconfigured in the OWNED state 56. That is, the IC device 12 may advance from the RMA state 58 to the OWNED state 56 in response to the blowing of the second fuse.

However, after receiving the IC device 12, the customer may discover one or more additional nonfunctional or defective operations, components, and/or elements on the IC device 12, which was previously configured in the RMA state 58 (at block 144). By using the techniques disclosed herein, the IC device 12 may be enabled to repeat an RMA. As such, the IC device 12 may receive (block 150) a third command to blow a third fuse and then blow (block 151) the third fuse. The third fuse may be blown during a time period beginning after the first fuse or second fuse is blown. Blowing the third fuse may disable access to the assets on the IC device 12 and cause the IC device 12 to be reconfigured in the RMA state 58. That is, the IC device 12, having previously been configured in the RMA state 58 and in the OWNED state 56, respectively, may proceed to the RMA state 58 again in response to the blowing of the third fuse. In some embodiments, when the IC device 12 is in a subsequent RMA state 58, the IC device 12 may maintain a level of confidentiality with regard to the assets on the IC device 12 comparable with previous level(s) of confidentiality in previous RMA(s).

It should be noted that one or more steps of the methods 70, 90, 120, and 140 described in this present disclosure may be combined with one or more steps of another method, such as of the method 70, 90, 120, or 140 described in this present disclosure. Further, it should be noted that, even though much of the present discussion was in the context of a customer and a manufacturer, in some embodiments, the IC device 12 may remain in ownership and/or position by a single entity. In these embodiments, the single entity may perform operations indicated above as performed by the customer and/or the manufacturer such as the operations commanding the RMA fuses of the IC device 12 to be blown. Indeed, in certain embodiments, the customer and the manufacturer may remain the same entity rather than being associated with different entities.

EXAMPLE EMBODIMENTS

EXAMPLE EMBODIMENT 1. An integrated circuit (IC) device configured for multiple return material authorizations (RMAs), the IC device comprising:
an asset disposed on the IC device; and
a return material authorization (RMA) counter fuse comprising a first fuse, a second fuse, and a third fuse, wherein the IC device enters an RMA state that disables access to the asset in response to blowing the first fuse, wherein the IC device enters a second state in response to blowing the second fuse, and wherein the IC device re-enters the RMA state in response to blowing the third fuse.

EXAMPLE EMBODIMENT 2. The IC device of example embodiment 1, wherein the asset comprises circuitry, non-volatile code, or a field programmable gate array circuit design, or a combination thereof.

EXAMPLE EMBODIMENT 3. The IC device of example embodiment 1, wherein the IC device blows the second fuse during a time period beginning after the first fuse is blown and wherein the IC device blows the third fuse during a time period beginning after the second fuse is blown.

EXAMPLE EMBODIMENT 4. The IC device of example embodiment 1, wherein the IC device enables access to the asset in response to the IC device leaving the RMA state.

EXAMPLE EMBODIMENT 5. The IC device of example embodiment 1, wherein the third fuse is blown during a time period beginning after the first fuse is blown.

EXAMPLE EMBODIMENT 6. The IC device of example embodiment 1, wherein a status of a fuse on the RMA counter fuse indicates a state of the IC device.

EXAMPLE EMBODIMENT 7. The IC device of example embodiment 1, wherein the IC device indicates an amount of times that the IC device has been in the RMA state based on a status of at least one of the first fuse, the second fuse, or the third fuse.

EXAMPLE EMBODIMENT 8. The IC device of example embodiment 1, wherein the fuses of the RMA counter fuse are configured to be blown by a single entity.

EXAMPLE EMBODIMENT 9. The IC device of example embodiment 1, wherein the first fuse, when blown, disables access to the asset, wherein the asset is owned by a third party.

EXAMPLE EMBODIMENT 10. The IC device of example embodiment 1, wherein at least one fuse of the RMA counter fuse is configured to be blown by a first entity and wherein at least one fuse is configured to be blown by a second entity.

EXAMPLE EMBODIMENT 11. The IC device of example embodiment 1, wherein the second state is an OWNED state, and wherein the IC device is configured to receive the asset while the IC device is in the OWNED state.

EXAMPLE EMBODIMENT 12. The IC device of example embodiment 1, wherein the RMA counter fuse comprises a fourth fuse, a fifth fuse, and a sixth fuse, and wherein the IC device re-enters the second state in response to blowing the fourth fuse, wherein the IC device re-enters the RMA state in response to blowing the fifth fuse, and wherein the IC device re-enters the second state in response to blowing the sixth fuse.

EXAMPLE EMBODIMENT 13. A tangible, non-transitory, and machine-readable medium comprising machine-readable instructions that, when executed by one or more processors of an integrated circuit (IC) device, cause the one or more processors to perform operations comprising:
receiving a first command to blow a first fuse on the IC device;
blowing the first fuse, wherein blowing the first fuse disables access to one or more assets on the IC device and causes the IC device to enter an RMA state;
receiving a second command to blow a second fuse on the IC device;
blowing the second fuse, wherein blowing the second fuse enables access to the one or more assets on the IC device and causes the IC device to leave the RMA state;
receiving a third command to blow a third fuse on the IC device; and
blowing the third fuse, wherein blowing the third fuse disables access to the one or more assets on the IC device and causes the IC device to re-enter the RMA state.

EXAMPLE EMBODIMENT 14. The medium of example embodiment 13, wherein the machine-readable instructions, when executed by the one or more processors, cause the IC device to enter an OWNED state in response to the one or more processors blowing the second fuse, and wherein the IC device is configured to receive an additional one or more assets when the IC device is in the OWNED state.

EXAMPLE EMBODIMENT 15. The medium of example embodiment 13, wherein the machine-readable instructions, when executed by the one or more processors, cause the IC device to leave an OWNED state in response to the one or more processors blowing the first fuse.

EXAMPLE EMBODIMENT 16. The medium of example embodiment 13, wherein the machine-readable instructions, when executed by the one or more processors, cause the one or more processors to perform operations comprising:
  receiving a fourth command to blow a fourth fuse on the IC device; and
  blowing the fourth fuse, wherein blowing the fourth fuse enables access to the one or more assets on the IC device and causes the IC device to leave the RMA state.

EXAMPLE EMBODIMENT 17. A method for configuring an integrated circuit (IC) device for multiple Return Material Authorizations (RMAs), the method comprising:
  receiving a first command to blow a first fuse on the IC device;
  blowing the first fuse, wherein blowing the first fuse disables access to one or more assets on the IC device and causes the IC device to enter an RMA state;
  receiving a second command to blow a second fuse on the IC device;
  blowing the second fuse, wherein blowing the second fuse enables access to the one or more assets on the IC device and causes the IC device to leave the RMA state;
  receiving a third command to blow a third fuse on the IC device; and
  blowing the third fuse, wherein blowing the third fuse disables access to the one or more assets on the IC device and causes the IC device to re-enter the RMA state.

EXAMPLE EMBODIMENT 18. The method of example embodiment 17, comprising:
  receiving a fourth command to blow a fourth fuse on the IC device; and
  blowing the fourth fuse, wherein blowing the fourth fuse enables access to the one or more assets on the IC device and causes the IC device to leave the RMA state.

EXAMPLE EMBODIMENT 19. The method of example embodiment 17, wherein the IC device enters an OWNED state in response to blowing the second fuse.

EXAMPLE EMBODIMENT 20. The method of example embodiment 17 performed by the IC device.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An integrated circuit (IC) device configured for multiple return material authorizations (RMAs), the IC device comprising:
  an asset disposed on the IC device; and
  a return material authorization (RMA) counter fuse comprising a first fuse, a second fuse, and a third fuse, wherein the IC device enters an RMA state that disables access to the asset in response to blowing the first fuse, wherein the IC device enters an OWNED state in response to blowing the second fuse, wherein the IC device blows the second fuse during a time period beginning after the first fuse is blown, and wherein the third fuse is blown during a time period beginning after the first fuse is blown.

2. The IC device of claim 1, wherein the asset comprises stored instructions, nonvolatile code, or a field programmable gate array circuit design, or a combination thereof.

3. The IC device of claim 1, wherein the IC device re-enters the RMA state in response to blowing the third fuse.

4. The IC device of claim 1, wherein the IC device enables access to the asset in response to the IC device leaving the RMA state.

5. The IC device of claim 1, wherein a status of a fuse on the RMA counter fuse indicates a state of the IC device.

6. The IC device of claim 1, wherein the IC device indicates an amount of times that the IC device has been in the RMA state based on a status of at least one of the first fuse, the second fuse, or the third fuse.

7. The IC device of claim 1, wherein the fuses of the RMA counter fuse are configured to be blown by a single entity.

8. The IC device of claim 1, wherein the first fuse, when blown, disables access to the asset, wherein the asset is owned by a third party.

9. The IC device of claim 1, wherein at least one fuse of the RMA counter fuse is configured to be blown by a first entity and wherein at least one fuse is configured to be blown by a second entity.

10. The IC device of claim 1, wherein the IC device is configured to receive the asset while the IC device is in the OWNED state.

11. The IC device of claim 1, wherein the RMA counter fuse comprises a fourth fuse, a fifth fuse, and a sixth fuse, and wherein the IC device re-enters the OWNED state in response to blowing the fourth fuse, wherein the IC device re-enters the RMA state in response to blowing the fifth fuse, and wherein the IC device re-enters the OWNED state in response to blowing the sixth fuse.

12. The IC device of claim 1, wherein the IC device is in a PRODUCTION state and a VIRGIN state prior to blowing the first fuse.

13. The IC device of claim 1, wherein the RMA state corresponds to a DISOWNED state.

14. A tangible, non-transitory, and machine-readable medium comprising machine-readable instructions that, when executed by one or more processors of an integrated circuit (IC) device, cause the one or more processors to perform operations comprising:
  receiving a first command to blow a first fuse on the IC device;
  blowing the first fuse, wherein blowing the first fuse disables access to one or more assets on the IC device and causes the IC device to enter an RMA state;
  receiving a second command to blow a second fuse on the IC device;

blowing the second fuse during a time period beginning after the first fuse is blown, wherein blowing the second fuse enables access to the one or more assets on the IC device and causes the IC device to leave the RMA state and enter an OWNED state, wherein the IC device is configured to receive an additional one or more assets in the OWNED state;

receiving a third command to blow a third fuse on the IC device; and blowing the third fuse, wherein blowing the third fuse disables access to the one or more assets on the IC device and causes the IC device to re-enter the RMA state.

15. The medium of claim 14, wherein the machine-readable instructions, when executed by the one or more processors, cause the IC device to leave the OWNED state in response to the one or more processors blowing the first fuse.

16. The medium of claim 14, wherein the machine-readable instructions, when executed by the one or more processors, cause the one or more processors to perform operations comprising:

receiving a fourth command to blow a fourth fuse on the IC device; and blowing the fourth fuse, wherein blowing the fourth fuse enables access to the one or more assets on the IC device and causes the IC device to leave the RMA state.

17. A method for configuring an integrated circuit (IC) device for multiple Return Material Authorizations (RMAs), the method comprising:

receiving a first command to blow a first fuse on the IC device;

blowing the first fuse, wherein blowing the first fuse disables access to one or more assets on the IC device and causes the IC device to enter an RMA state;

receiving a second command to blow a second fuse on the IC device;

blowing the second fuse during a time period beginning after the first fuse is blown, wherein blowing the second fuse enables access to the one or more assets on the IC device and causes the IC device to enter an OWNED state;

receiving a third command to blow a third fuse on the IC device; and blowing the third fuse, wherein blowing the third fuse disables access to the one or more assets on the IC device and causes the IC device to re-enter the RMA state.

18. The method of claim 17, comprising:

receiving a fourth command to blow a fourth fuse on the IC device; and blowing the fourth fuse, wherein blowing the fourth fuse enables access to the one or more assets on the IC device and causes the IC device to leave the RMA state.

19. The method of claim 17 performed by the IC device.

20. The method of claim 17, wherein the IC device is configured to receive one or more additional assets in the OWNED state.

* * * * *